United States Patent [19]

Dueck et al.

[11] Patent Number: 5,200,677
[45] Date of Patent: Apr. 6, 1993

[54] METHOD AND APPARATUS FOR CONTROLLING POSITIONING MEANS

[75] Inventors: Gunter Dueck, Neckargemuend; Ulrich Schauer, Sinsheim, both of Fed. Rep. of Germany

[73] Assignee: International Business Machines Corporation, Armonk, N.Y.

[21] Appl. No.: 877,309

[22] Filed: May 1, 1992

[30] Foreign Application Priority Data

Jul. 18, 1991 [EP] European Pat. Off. ........ 91112012.9

[51] Int. Cl.⁵ ............................................. G05B 19/405
[52] U.S. Cl. ................................... 318/567; 318/570; 364/474.29; 364/191
[58] Field of Search ................ 318/560–579; 364/474.01–474.34, 191, 188

[56] References Cited

U.S. PATENT DOCUMENTS

| | | | |
|---|---|---|---|
| 4,546,427 | 10/1985 | Kishi et al. | 318/570 X |
| 4,755,926 | 7/1988 | Kishi et al. | 364/191 |
| 4,755,927 | 7/1988 | Kishi et al. | 364/191 |
| 4,870,597 | 9/1989 | Seki et al. | 364/474.29 |
| 4,893,251 | 1/1990 | Seki et al. | 318/570 X |
| 4,905,158 | 2/1990 | Seki et al. | 364/474.29 |
| 4,949,270 | 8/1990 | Shima et al. | 364/474.26 |

FOREIGN PATENT DOCUMENTS 590909 2/1987 Australia .

OTHER PUBLICATIONS

Data Processing Bd. 12, Nr. 16, Nov. 1970, London GB, Seiten 466–468; C. W. Facey: "Robot path planning for wiring of cable harnesses".

*Primary Examiner*—Paul Ip
*Attorney, Agent, or Firm*—Richard Lau

[57] ABSTRACT

A plurality of individual positions arranged on a surface area are toured. The individual positions are grouped such that each group occupies a continuous partial area in the positioning plane. The groups are ordered so that the partial areas adjoin each other, forming in their totality a geometrical coarse structure. The individual positions are continuously indexed such that their sequence follows the geometrical coarse structure. The indexing of the individual positions is altered in sections such that the time required for sequentially touring all the individual positions of a section is minimized.

13 Claims, 4 Drawing Sheets

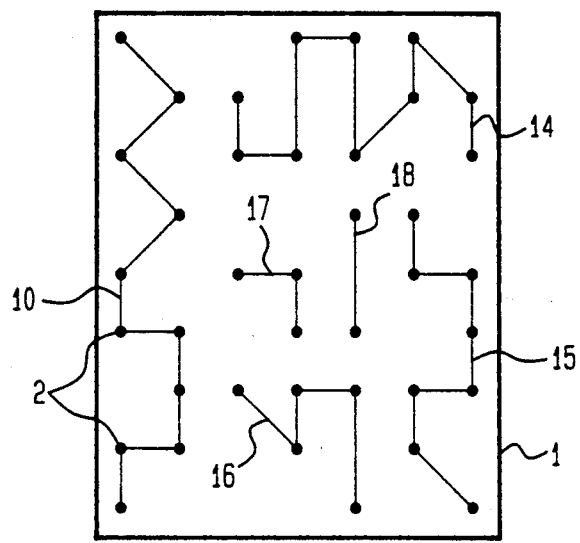
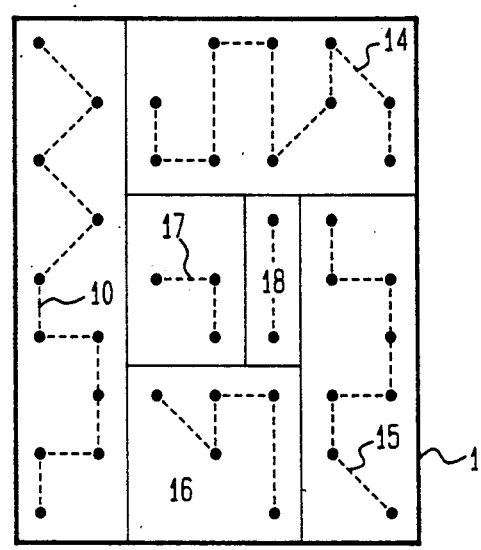
FIG. 6  FIG. 7
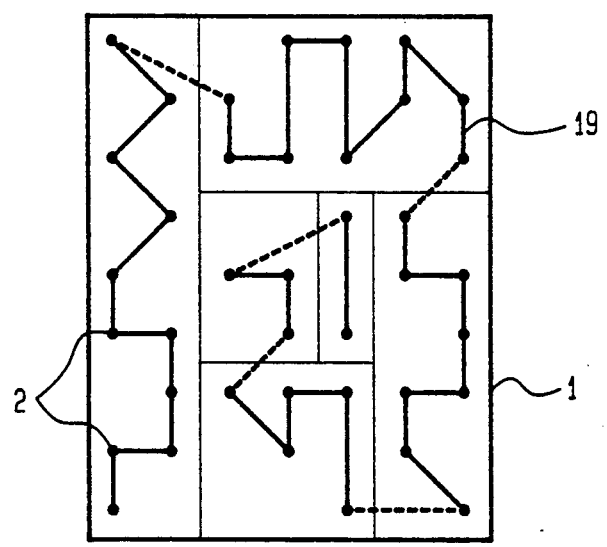
FIG. 8

METHOD AND APPARATUS FOR CONTROLLING POSITIONING MEANS

TECHNICAL FIELD

The present invention relates generally to accessing a position or location of a workpiece during manufacturing processes and, more specifically, to accessing or touring a large number of individual and distinct positions or locations of a workpiece.

BACKGROUND OF THE INVENTION

During manufacturing, various positions or locations of a workpiece, such as a board or plate, may be required to be accessed or toured for various purposes. Such purposes may include punching or drilling holes at these locations. In some schemes, the workpiece is placed on a movable positioning table, and the tool or processing means is stationary. In other schemes, the workpiece is stationary and the processing means is moved to the various locations of the workpiece. In either scheme, the operating mechanism is generally controlled by an electronic device or a processor unit.

A large number of methods for controlling positioning means exist which differ with regard to their objective.

Most workpieces have a surface which requires numerous distinct positions located thereon to be toured or accessed. One example of such a surface 1 is shown schematically in FIG. 1. The surface 1 includes a plurality of targets arranged thereon. The targets are the individual points or positions 2 which are to be accessed or toured. The location of these targets may be determined, for example, by a rectangular coordinate system X,Y. For functional efficiency, the individual positions 2, which may also be distributed at random, are frequently arranged in a predetermined raster 3. Minimizing the required positioning path normally implies finding a solution to the so-called "Travelling Salesman Problem" (hereinafter referred to as the TSP), i.e., it is required to determine the shortest possible path for accessing each individual position 2. Since accurately computing this problem for a relatively large number of positions (for example, more than 100) generally surpasses the capacity of existing processors, approximation methods have been developed. For minimizing the processing time needed for a workpiece, an essential additional parameter to be included in TSP computations is the acceleration/deceleration characteristic of the positioning mechanism. The positioning paths obtained as a TSP solution depend strongly on the location and the number of predetermined targets. Thus, slight changes of the current pattern arising, for example, from adding or eliminating a few positions, result in a totally different configuration of the respective positioning path. A TSP positioning path 4 is schematically represented in FIG. 2.

In this manner, specific sequences of movements occur for each type of workpiece or variant during the manufacturing process. Consequently, slight (but invariably present) tolerances of the positioning mechanism affect each workpiece differently, i.e. tolerance—related positional deviations vary from one workpiece to another. For manufacturing workpieces for which all the individual positions have to be toured with reproducible accuracy, for instance, in the case of successively produced individual board layers whose plated throughholes have to be accurately aligned during stacking, a pure TSP approach poses precision problems.

The desired accuracy is obtained by abandoning that approach and by positioning each workpiece during the processing cycle according to a predetermined pattern. For this purpose, a predetermined positioning path is travelled irrespective of how the workpieces differ with regard to the location and number of the individual positions to be toured. Examples of this are meander or spiral-shaped paths 5, 6. Such positioning paths are used in engineering and are schematically represented in FIGS. 3 and 4. They allow a very high reproducible accuracy. However, disadvantageously, the very long positioning paths associated with these schemes cause increased time requirements for accessing each position of each workpiece.

SUMMARY OF THE INVENTION

It is therefore an object of the present invention to provide an apparatus and method for controlling positioning means, which minimizes time requirements and allows for a high degree of reproducible accuracy.

In order to accomplish the above object and other objects of the invention, an apparatus and method according to the invention is provided for touring positions on a surface, by arranging the position in a coarse basic pattern and utilizing the course pattern to optimize route (time) requirements. For this purpose, a coarse positioning path structure is provided for each workpiece. In addition, as a result of the minimized route length and time requirements, a positioning path, for example, in the form of a meander is defined in the coarse structure. To this end, the mechanical characteristics of the positioning means may be taken into account. As a result of the existing coarse structure, the positioning path is similar even for different workpieces. The combination according to the invention of utilizing a predetermined coarse structure with local route (time) optimization affords reproducible accuracy values and high positioning speeds.

BRIEF DESCRIPTION OF THE DRAWINGS

Further details and advantages of the invention will be explained below with reference to examples illustrated in the accompanying drawings, in which:

FIG. 6 shows individual meander paths;

FIG. 7 shows a spiral-shaped configuration of a coarse structure formed by various surface sections;

FIG. 8 shows a continuous positioning path within the spiral-shaped coarse structure of FIG. 7;

DETAILED DESCRIPTION OF THE PREFERRED EMBODIMENT

According to the invention, all the points to be toured on a workpiece surface are divided up into a coarse primary or basic pattern. The coarse structure is essentially the same for all workpieces, i.e. irrespective of individual differences, such as quantity and/or location of targets. The (coarse) sequence of movement for touring the various individual positions is analogous for any type of workpiece. This ensures a reproducible degree of accuracy which corresponds to that of pure meander or spiral routes.

As it is frequently desirable to minimize the time required for positioning, the geometrical lengths of individual routes between two positions may be weighted according the acceleration/deceleration characteristic of the positioning mechanism when the coarse structure is determined. For this purpose, the length of a route section equals the time needed for touring it.

More specifically, the coarse structure is formed by dividing the individual positions into groups, with each group occupying a portion of the workpiece surface. The sequence of the groups on the workpiece surface determines the coarse structure.

FIGS. 5 A-D illustrate a preferred embodiment of the invention. Generally speaking, in the boundary area of the surface 1 to be determined, a group is formed by successively associating individual points or targets 2 with each other according to the selection criteria explained hereinbelow. Then, the next group is formed for an area of the positioning surface 1 rotated through 90°. As a result, the sequence of the groups follows a spiral-shaped course.

Figure 5A:
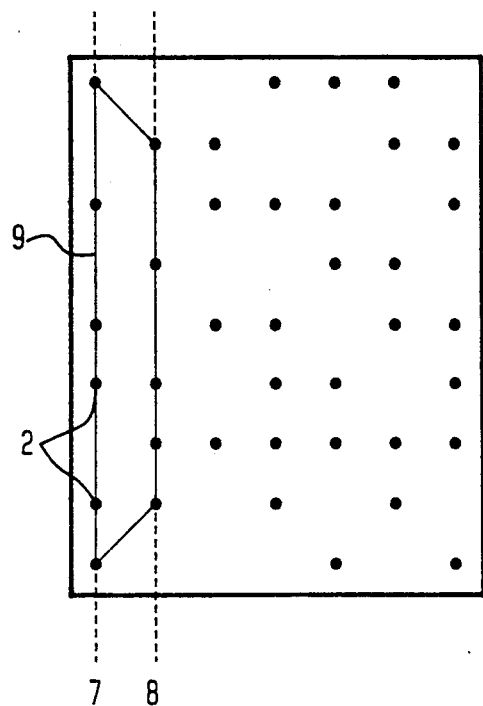
FIGS. 5A-D illustrate dividing up of the surface area of a workpiece into individual sections.

Starting from one side of the workpiece surface, the points 2 on the outer-most coordinate line 7 are initially connected to the points 2 on the adjacent parallel coordinate line 8 in the form of a closed polygon 9 (FIG. 5A). The length of this polygon 9 is compared with the length of a meander-shaped connecting line 10 (FIG. 5B) extending through the same points 2. The meander route is obtained by first successively approaching or accessing all the points 2 that are on a common transverse coordinate first line. From the end point of the transverse line section thus obtained, the next point on an adjacent transverse coordinate second line is accessed or approached. If there are several adjacent points 2 on that second line so as to also make up a transverse line section, then the point on the second line with the shortest distance to the next point on the first line is used as the end point from which to access the next point on the first line.

If the route of the closed polygon 9 is shorter than the meander route 10, only the connection of the points on the outer-most coordinate line 7 is retained as a straight line, and route comparison is repeated to other coordinate lines after a 90° rotation of the positioning surface 1.

Figure 5B:
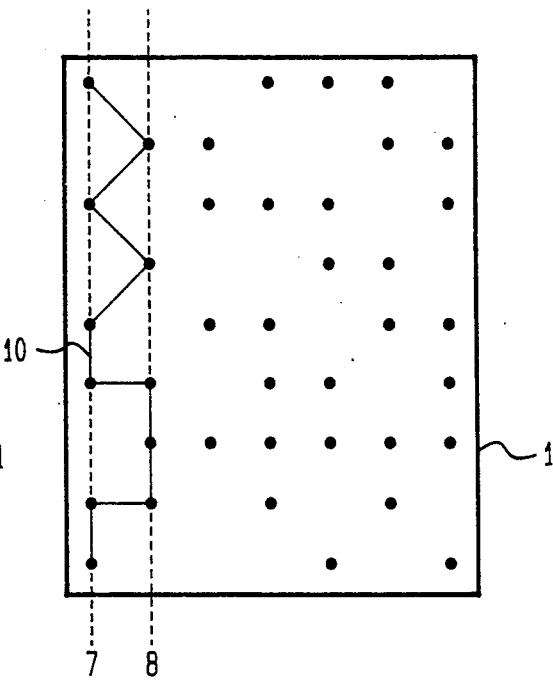
Figure 5C:
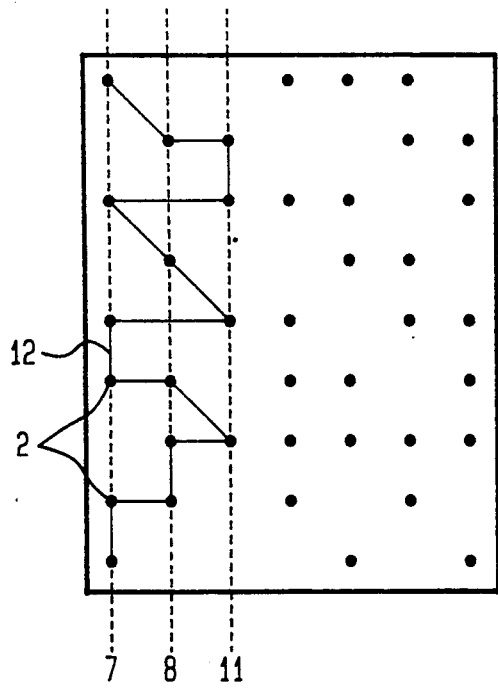
Figure 5D:
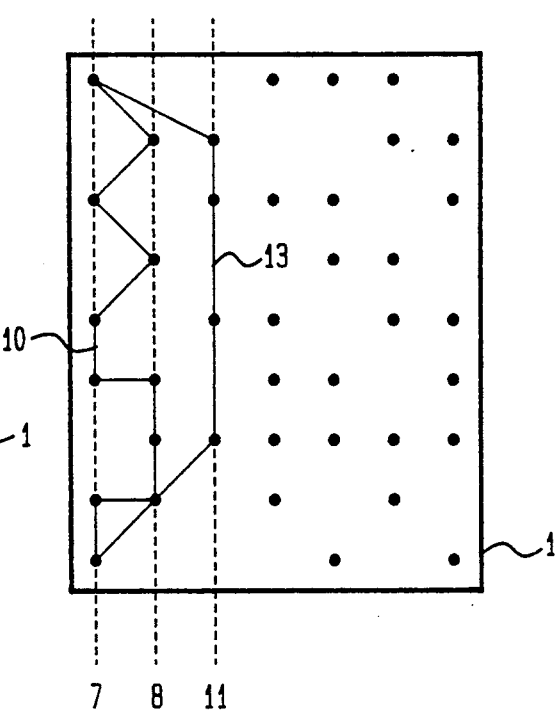

If the meander route 10 is shorter than the route of the closed polygon 9, a further coordinate line 11 is considered (FIG. 5C) and a new meander route 12 is obtained using the scheme as described hereinabove with respect to meander route 10 of FIG. 5B. The new meander route 12 is then compared with the relevant closed route 13. The closed route 13 is derived from the previous meander route 10 and the linear connection of the new points on the newly added coordinate line 11 (FIG. 5D).

The result of the route length comparison again decides whether the points on a further parallel coordinate line are to be considered or whether the above described scheme should be applied to a new section after a 90° rotation.

In this way, individual polygons 10, 14, 15, 16, 17, 18 or meander routes of different width (FIG. 6) are obtained. (For the example illustrated in FIG. 6 the polygons have been arbitrarily determined.)

Figure 3:
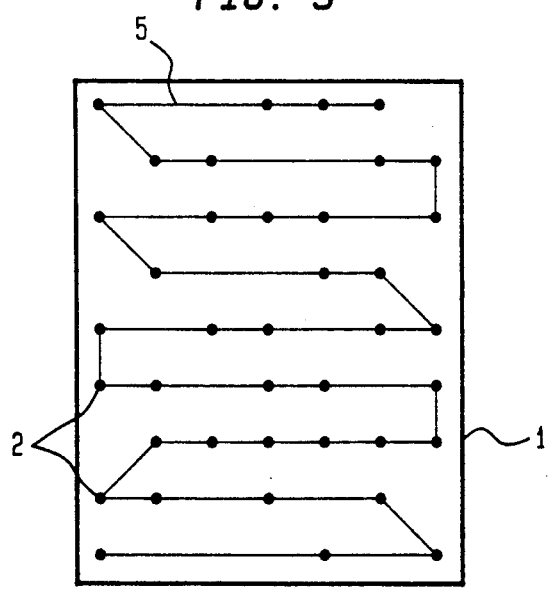
FIG. 3 shows a meander positioning path.
Figure 4:
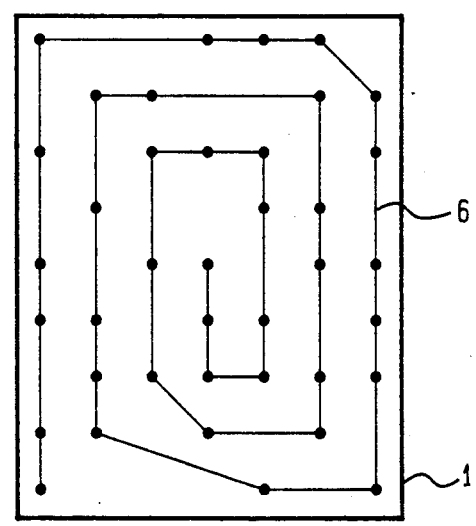
FIG. 4 shows a spiral-shaped positioning path.

When the length of the meander and the closed route are compared, an acceptance value may be set for determining when to use the meander route. For instance, the meander route 10 may be accepted if it is at least 95% of the closed route 17. By altering the acceptance value, the average meander width may be controlled, i.e. if compared with the closed route only substantially shorter meander routes are accepted, discontinuance is likely. Further points on adjacent coordinate lines will not be considered and the meander width will not increase further. Conversely, very wide meanders may result from a less rigid acceptance value. A pure meander (FIG. 3) or spiral (FIG. 4) as extremal structures can thus be obtained in the form of a polygon covering the entire surface area.

After completion of the scheme as described hereinabove, surface area 1 is divided up into several rectangles which, joined in sequence, form a spiral structure, as is shown in FIG. 7.

Thus, a coarse structure is defined which serves to determine a preliminary positioning path which will be defined as described hereinafter.

Next, as shown in FIG. 8, a preliminary positioning path 19 is generated by first configuring individual path sections by linking the individual positions 2 in each section of the coarse structure, i.e., in the rectangles as illustrated in FIG. 7. The individual path sections are, for example, meander-shaped. The individual path sections are then connected to adjacent path sections. When the coarse structure is determined by means of the previously described preferred embodiment, a corresponding meander-shaped path is already obtained. The meander-shaped path thus obtained, although affording a high and reproducible positioning accuracy because of its inherent coarse structure, has still to be optimized with regard to its length.

Generally, since the time required for positioning rather the pure route length must be minimized, individual routes between two positions may also be weighted in the optimization step to follow, according to the acceleration/deceleration characteristics of the positioning mechanism.

Figure 1:
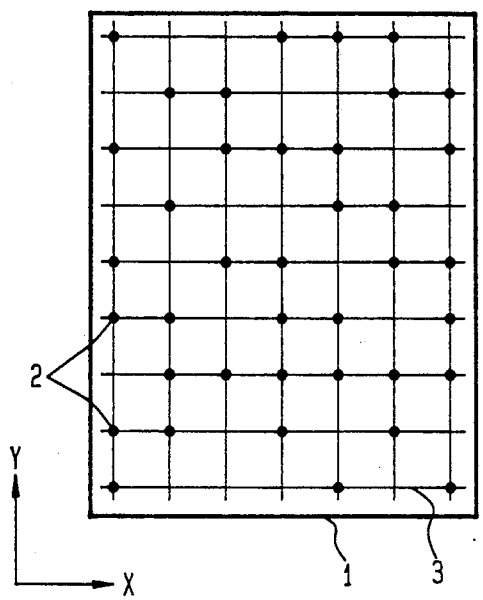
FIG. 1 shows a surface of a workpiece with a multitude of positions located thereon.
Figure 2:
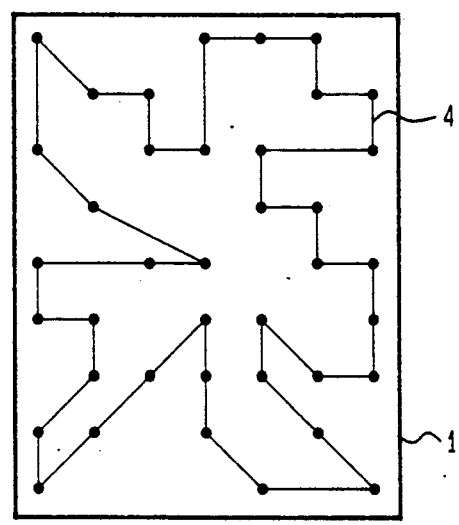
FIG. 2 shows a surface of a workpiece with a path for accessing the positions thereon.

As a final step according to the preferred embodiment, the route length and, if desired, also the time required for positioning, are reduced by taking into account the coarse structure. For this purpose, smaller path sections (e.g. groups of about 10 individual positions) are restructured and the entire path length (optionally by considering the time required for acceleration and deceleration, as explained above) is successively minimized by continuous incrementation. For this purpose, suitably adapted TSP solutions may be used. The preferred method uses the so-called threshold accepting method (G. Dueck and T. Schauer in 'Journal of Computational Physics', Vol. 90, No. 1, Sep. 1990, pp. 161-175). The result is a final positioning path which, despite the predetermined coarse structure, has a total—optionally time-optimized—length that falls short of the pure TSP solution by only about a few percent. Compared with pure meander or spiral paths (FIG. 2 or 3), the route length—and the time required for positioning, respectively—can be reduced on an average by about 30 percent.

Figure 9:
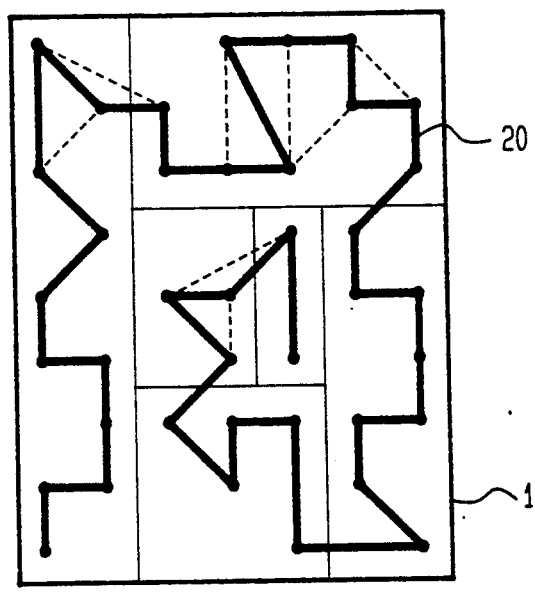
FIG. 9 shows a final positioning path after route optimization.
Figure 10:
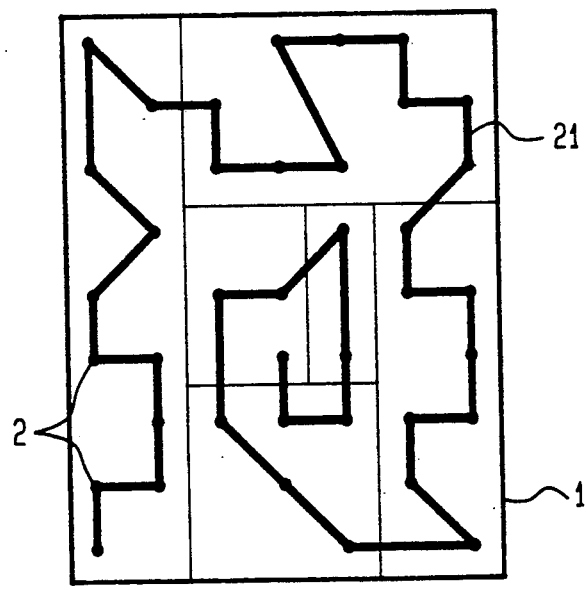
FIG. 10 also shows a final positioning path after route optimization.

FIG. 9 shows an optimized positioning path 20 for which only a few individual positions 2 of each path section have been considered for local TSP route optimization, thus retaining the coarse structure in its original form. By predetermining a correspondingly large number of individual positions, which make up a section in an optimization step, details of the coarse structure may be abandoned in favor of a more TSP-oriented positioning path 21 (FIG. 10). In a borderline case, a pure TSP solution path (FIG. 4) is obtained which considers all existing positions.

The method according to the invention also permits defining complex positioning paths with a very large number of individual positions (>several 1000) in a short time. The preferred manner in which the problem of reducing the total route length or the time requirements is subdivided into successively implemented partial optimizations considering only relatively few positions, also lends itself to position optimization in small computer or processor systems. As up-to-date positioning means are normally processor-controlled, the method according to the invention may be used for in situ optimization to allow a flexible response to modifications of workpieces during their manufacture.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of controlling a tool for processing predetermined workpiece surface target locations on a workpiece surface, comprising the steps of:
   dividing a workpiece surface having a plurality of predetermined workpiece surface target locations thereon into sections so as to form a geometrical coarse structure, wherein the workpiece surface target locations within each section forms a geometrical fine structure;
   forming an individual route within each section, wherein each workpiece surface target location within each section is accessible by the individual route corresponding to the section in which the workpiece surface target location is located;
   forming a final accessing route, wherein each individual route is accessible from an adjacent individual route, and wherein each workpiece surface target location is accessible by the final accessing route; and
   successively processing each workpiece surface target location in accordance with the final accessing route with the tool.

2. Method according to claim 1, wherein the geometrical coarse structure is spiral or meander-shaped.

3. Method according to claim 1, wherein the sequence of the workpiece surface target locations forming the geometrical fine structure is determined by route length reduction.

4. Method according to claim 3, wherein the sequence of the workpiece surface target locations is determined in sections for groups of workpiece surface target locations.

5. Method according to claim 4, wherein the sequence of the various workpiece surface target locations is successively determined by continuous incrementation.

6. Method according to claim 2, wherein the sequence of the workpiece surface target locations forming the geometrical fine structure is determined by route length reduction.

7. Method according to claim 6, wherein the sequence of the workpiece surface target locations is determined in sections for groups of workpiece surface target locations.

8. Method according to claim 7, wherein the sequence of the various workpiece surface target locations is successively determined by continuous incrementation.

9. Method according to any of the preceding claims, wherein route lengths between two successive workpiece surface target locations are weighted such that route lengths are taken into account from a time requirement aspect.

10. A method of controlling a tool for processing a plurality of predetermined and initially unaccessed workpiece surface target locations on a workpiece surface, comprising the steps of:
   a) dividing the unaccessed workpiece surface target locations into sets, each set comprising a line of unaccessed workpiece surface target locations, wherein an outer-most line being a first considered set of target locations and the next adjacent line being a second considered set of target locations;
   b) measuring the length of a closed polygon route formed by accessing the considered sets of target locations in accordance with a polygon;
   c) measuring the length of a meander route formed by accessing the considered sets of target locations in accordance with a meander;
   d) unless all workpiece surface target locations are accessed by a preliminary accessing route, comparing the length of said closed polygon route with the length of said meander route and, (i) in the instance wherein the length of said meander route is within a predetermined acceptable range of the length of said closed polygon route, forming a preliminary accessing route using the accessing of said first considered set of target locations, rotating the workpeice surface by 90 degrees and repeating steps a through d and, (ii) in the instance wherein the length of said meander route is not within the predetermined acceptable range of the length of said closed polygon route, considering the next adjacent line as a further considered set of target locations and repeating steps b through d;
   e) forming a final accessing route which sequentially accesses all preliminary accessing routes; and
   f) sequentially processing each workpiece surface target location with the tool in accordance with the final accessing route.

11. A method according to claim 10, wherein said meander route is formed starting accessing from an end location of said first considered set of target locations and according to the following steps:
   a) if the last target location accessed has locations within its respective set of target locations which are consecutively adjacent therefrom, successively accessing the consecutively adjacent target locations until reaching the target location closest to the next target location to be accessed in the other considered sets of target locations;

b) accessing the next target location to be accessed in the other considered sets of target locations from the last target location accessed; and c) repeating steps (a) through (b) until all target locations of the considered sets of target locations are accessed.

12. A method according to claim 10, wherein said step of dividing comprises dividing the unaccessed workpiece surface target locations into lines of unaccessed workpiece surface target locations which are parallel to one another.

13. A method according to claim 10, wherein said step of measuring comprises forming a closed polygon route using a meander route previously formed.

* * * * *